(12) United States Patent
I et al.

(10) Patent No.: US 9,647,006 B2
(45) Date of Patent: May 9, 2017

(54) LIGHT SHIELDING PATTERN PIXEL STRUCTURE HAVING A ONE SIDE OVERLAPPING SCAN LINE

(71) Applicant: Au Optronics Corporation, Hsinchu (TW)

(72) Inventors: Chu-Hsuan I, Hsinchu (TW); Yi-Wei Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/985,463

(22) Filed: Dec. 31, 2015

(65) Prior Publication Data

US 2017/0025439 A1  Jan. 26, 2017

(30) Foreign Application Priority Data

Jul. 23, 2015  (TW) .............................. 104123942 A

(51) Int. Cl.
*H01L 27/12* (2006.01)
*H01L 29/78* (2006.01)
*H01L 29/786* (2006.01)

(52) U.S. Cl.
CPC ...... *H01L 27/124* (2013.01); *H01L 29/78621* (2013.01); *H01L 29/78633* (2013.01); *H01L 29/78696* (2013.01)

(58) Field of Classification Search
CPC ............. H01L 27/124; H01L 29/78621; H01L 29/78633; H01L 29/78696
See application file for complete search history.

(56) References Cited

U.S. PATENT DOCUMENTS

| | | | |
|---|---|---|---|
| 6,452,241 B1 * | 9/2002 | Fukata | G02F 1/136209 257/350 |
| 6,573,955 B2 * | 6/2003 | Murade | G02F 1/136209 257/59 |
| 7,027,109 B2 * | 4/2006 | Sera | G02F 1/136209 349/110 |

(Continued)

FOREIGN PATENT DOCUMENTS

| | | |
|---|---|---|
| CN | 1485655 | 3/2004 |
| CN | 1677206 | 10/2005 |

(Continued)

*Primary Examiner* — Ida M Soward
(74) *Attorney, Agent, or Firm* — Jianq Chyun IP Office

(57) ABSTRACT

An active device of a pixel structure includes a semiconductor layer, an insulation layer covering the semiconductor layer, a gate electrode disposed on the insulation layer and electrically connected to a scan line, a protection layer covering the gate electrode, a source electrode and a drain electrode electrically connected to a source region and a drain region of the semiconductor layer. A channel region is disposed between the source region and the drain region. A source lightly doped region is disposed between the channel region and the source region. A drain lightly doped region is disposed between the channel region and the drain region. The light shielding pattern shields the source region, the drain region, the source lightly doped region and the drain lightly doped region. The light shielding pattern is overlapped with one side of the scan line and not overlapped with another side of the scan line.

14 Claims, 6 Drawing Sheets

(56) References Cited

U.S. PATENT DOCUMENTS

| | | | |
|---|---|---|---|
| 7,075,704 B2 * | 7/2006 | Kurashina | G02F 1/136259 257/758 |
| 7,507,998 B2 * | 3/2009 | Tseng | H01L 27/1255 257/300 |
| 7,663,709 B2 * | 2/2010 | Nagasawa | G02F 1/1345 349/39 |
| 7,682,883 B2 | 3/2010 | Cho et al. | |
| 7,790,526 B2 * | 9/2010 | Tseng | H01L 27/1255 257/59 |
| 7,800,718 B2 * | 9/2010 | Nakagawa | G02F 1/13454 257/431 |
| 7,816,258 B2 * | 10/2010 | Moriwaki | H01L 29/458 257/E29.151 |
| 8,031,300 B2 * | 10/2011 | Kamijima | G02F 1/136209 349/110 |
| 8,129,807 B2 * | 3/2012 | Nakagawa | H01L 29/42384 257/435 |
| 8,168,982 B2 * | 5/2012 | Ishii | G02F 1/136209 257/72 |
| 8,415,182 B2 | 4/2013 | Cho et al. | |
| 8,575,696 B2 * | 11/2013 | Shibata | G02F 1/136209 257/296 |
| 9,219,157 B2 * | 12/2015 | Shibata | G02F 1/136209 |
| 9,362,410 B2 * | 6/2016 | Shibata | G02F 1/136209 |
| 2002/0024622 A1 * | 2/2002 | Murade | G02F 1/136209 349/44 |
| 2006/0246360 A1 * | 11/2006 | Hwang | H01L 27/1214 430/5 |
| 2007/0298610 A1 * | 12/2007 | Itagaki | H01L 21/28518 438/679 |
| 2008/0296581 A1 | 12/2008 | Chao et al. | |
| 2009/0286336 A1 | 11/2009 | Cho et al. | |
| 2010/0078666 A1 * | 4/2010 | Mochiku | H01L 29/78624 257/98 |
| 2010/0099206 A1 | 4/2010 | Cho et al. | |
| 2013/0021542 A1 * | 1/2013 | Ito | G02F 1/133345 349/5 |
| 2014/0203285 A1 * | 7/2014 | Ito | H01L 27/124 257/72 |
| 2014/0218654 A1 | 8/2014 | Ochiai et al. | |
| 2014/0347618 A1 * | 11/2014 | Shirai | G02F 1/1339 349/153 |
| 2015/0028341 A1 * | 1/2015 | Sun | H01L 27/124 257/72 |
| 2015/0108483 A1 | 4/2015 | Lee et al. | |
| 2015/0311232 A1 * | 10/2015 | Sun | G02F 1/136227 257/72 |
| 2015/0318359 A1 * | 11/2015 | Shimomura | H01L 29/24 257/43 |

FOREIGN PATENT DOCUMENTS

| | | |
|---|---|---|
| CN | 101071238 | 11/2007 |
| TW | I238277 | 8/2005 |
| TW | 200950066 | 12/2009 |
| TW | 201203559 | 1/2012 |
| TW | 201516521 | 5/2015 |

* cited by examiner

LIGHT SHIELDING PATTERN PIXEL STRUCTURE HAVING A ONE SIDE OVERLAPPING SCAN LINE

CROSS-REFERENCE TO RELATED APPLICATION

This application claims the priority benefit of Taiwan application serial no. 104123942, filed on Jul. 23, 2015. The entirety of the above-mentioned patent application is hereby incorporated by reference herein and made a part of this specification.

BACKGROUND OF THE INVENTION

1. Field of the Invention

The invention relates to a semiconductor structure, and particularly relates to a pixel structure.

2. Description of Related Art

The increasing progresses of the display technology bring great conveniences to people's daily life, in which flat panel displays (FPDs) become popular due to its feature of being light and thin. Generally speaking, the pixel structure in the FPD includes an active device and a pixel electrode electrically connected to the active device. The active device serves as a switch element of a display unit. The active device includes a semiconductor layer, an insulating layer covering the semiconductor layer, a gate electrode located on the insulating layer and electrically connected to the scan line, a protection layer covering the gate electrode and a source electrode and a drain electrode located on the protection layer. To reduce a current leakage of the active device, the pixel structure further includes a light shielding layer disposed below the semiconductor layer, so as to completely shield the semiconductor layer. However, disposing the light shielding pattern then reduces the aperture ratio of the pixel structure.

SUMMARY OF THE INVENTION

The invention provides a pixel structure having a high aperture ratio.

A pixel structure according to an embodiment includes a scan line and a data line intersecting each other, an active device electrically connected to the scan line and the data line, a pixel electrode electrically connected to a drain electrode of the active device and a light shielding pattern. The active device includes a semiconductor layer, an insulating layer covering the semiconductor layer, a gate electrode located on the insulating layer and electrically connected to the scan line, a protection layer covering the gate electrode and a source electrode and the drain electrode located on the protection layer. The semiconductor layer includes a source region, a drain region, a channel region, a source lightly doped region, and a drain lightly doped region. The channel region is located between the source region and the drain region. The source lightly doped region is located between the channel region and the source region. The drain lightly doped region is located between the channel region and the drain region. The gate electrode is located above the channel region. The source electrode and the drain electrode are respectively electrically connected to the source region and the drain region. The source electrode is electrically connected to the data line. A light shielding pattern shields the source region, the drain region, the source lightly doped region and the drain lightly doped region of the semiconductor layer. The light shielding pattern is overlapped with a side of the scan line and not overlapped with another side of the scan line.

Based on above, the pixel structure according to the embodiments adopts the design "the light shielding pattern is overlapped with a side of the scan line, and not overlapped with another side of the scan line", such that the light shielding pattern may shield the region that may easily have a current leakage and reduce a size thereof, so as to increase the aperture ratio of the pixel structure.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
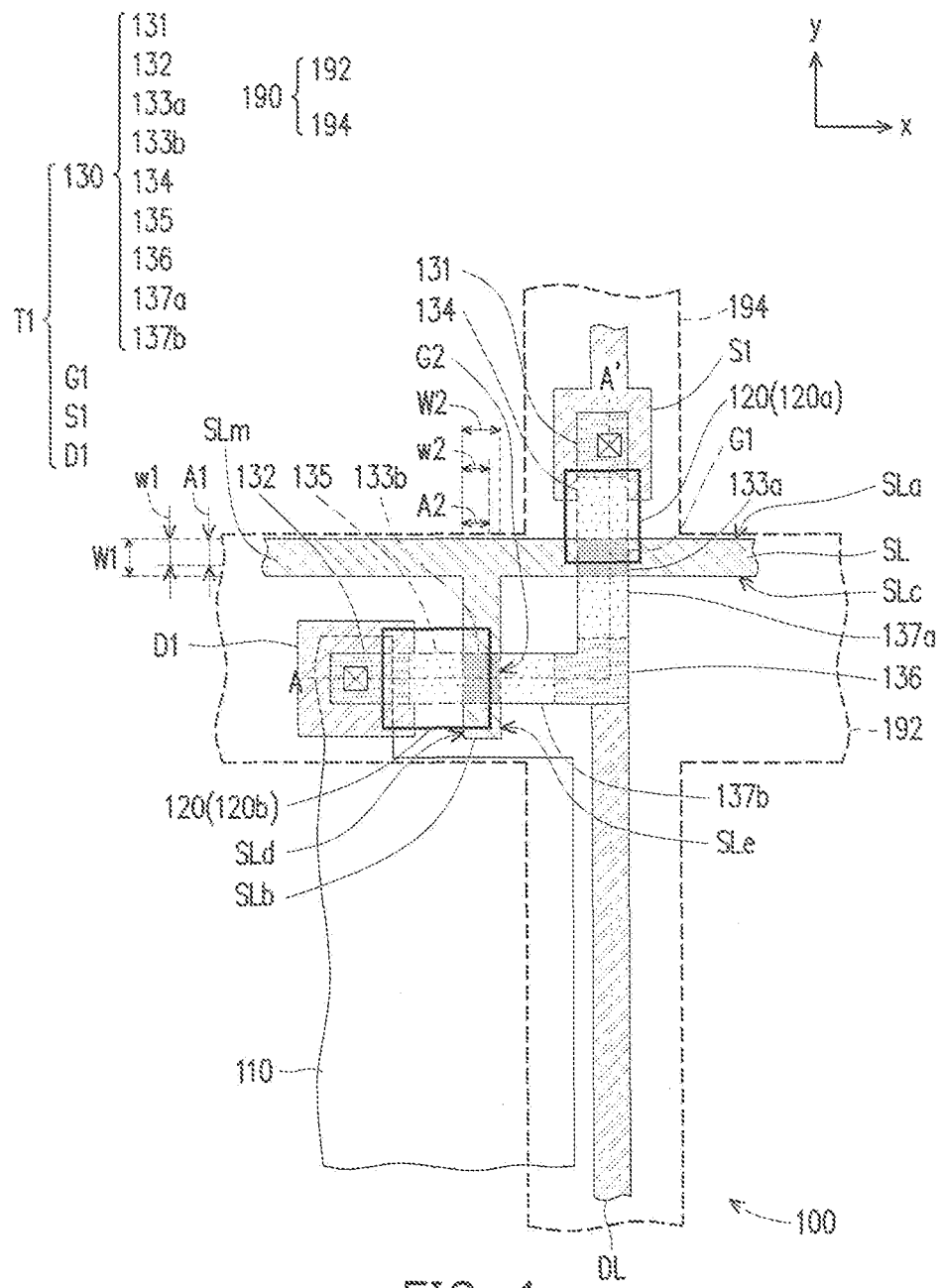
FIG. 1 is a schematic bottom view illustrating a display panel using a pixel structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
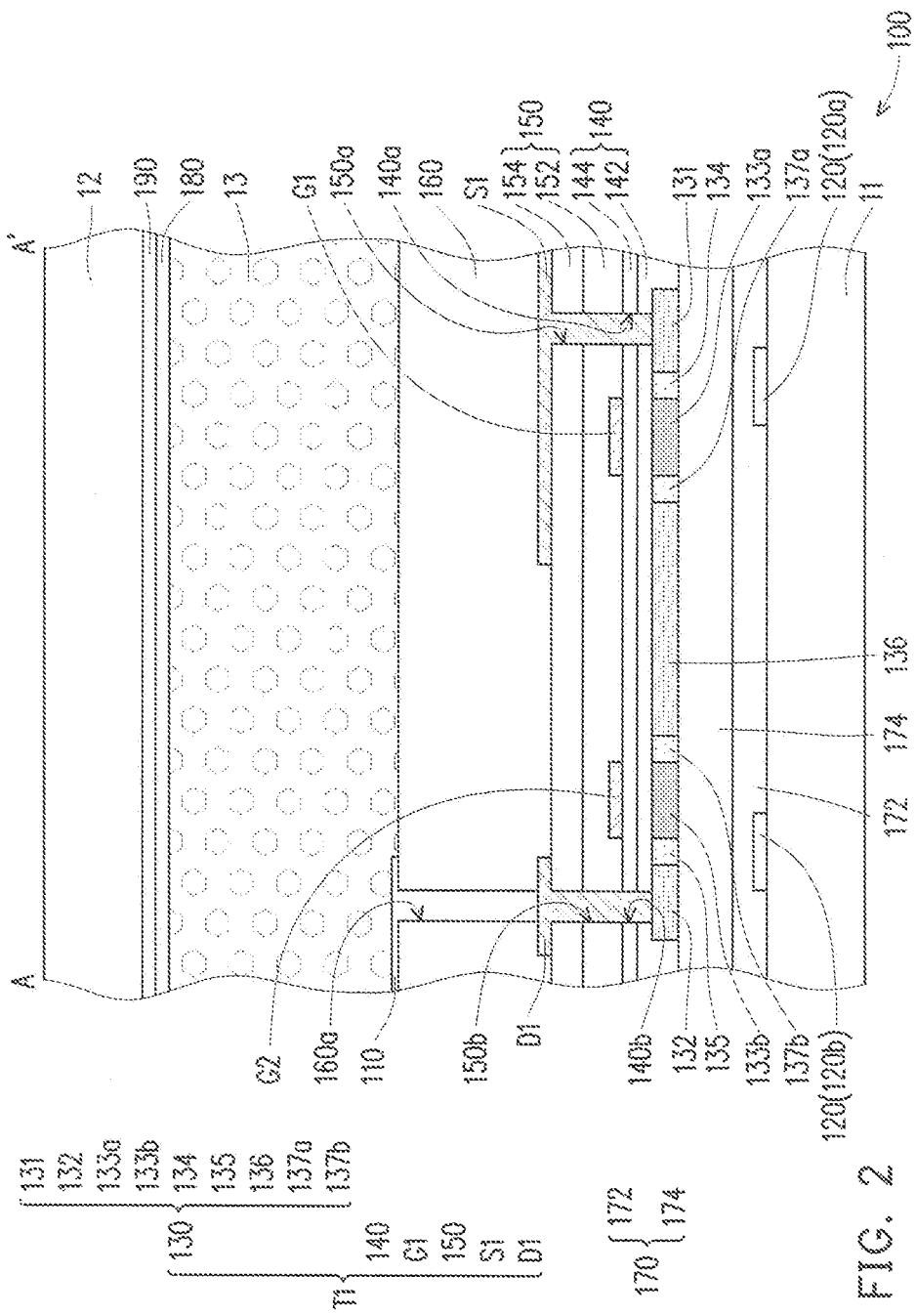
FIG. 2 is a schematic cross-sectional view illustrating a display panel using a pixel structure according to an embodiment of the invention.
Figure 3:
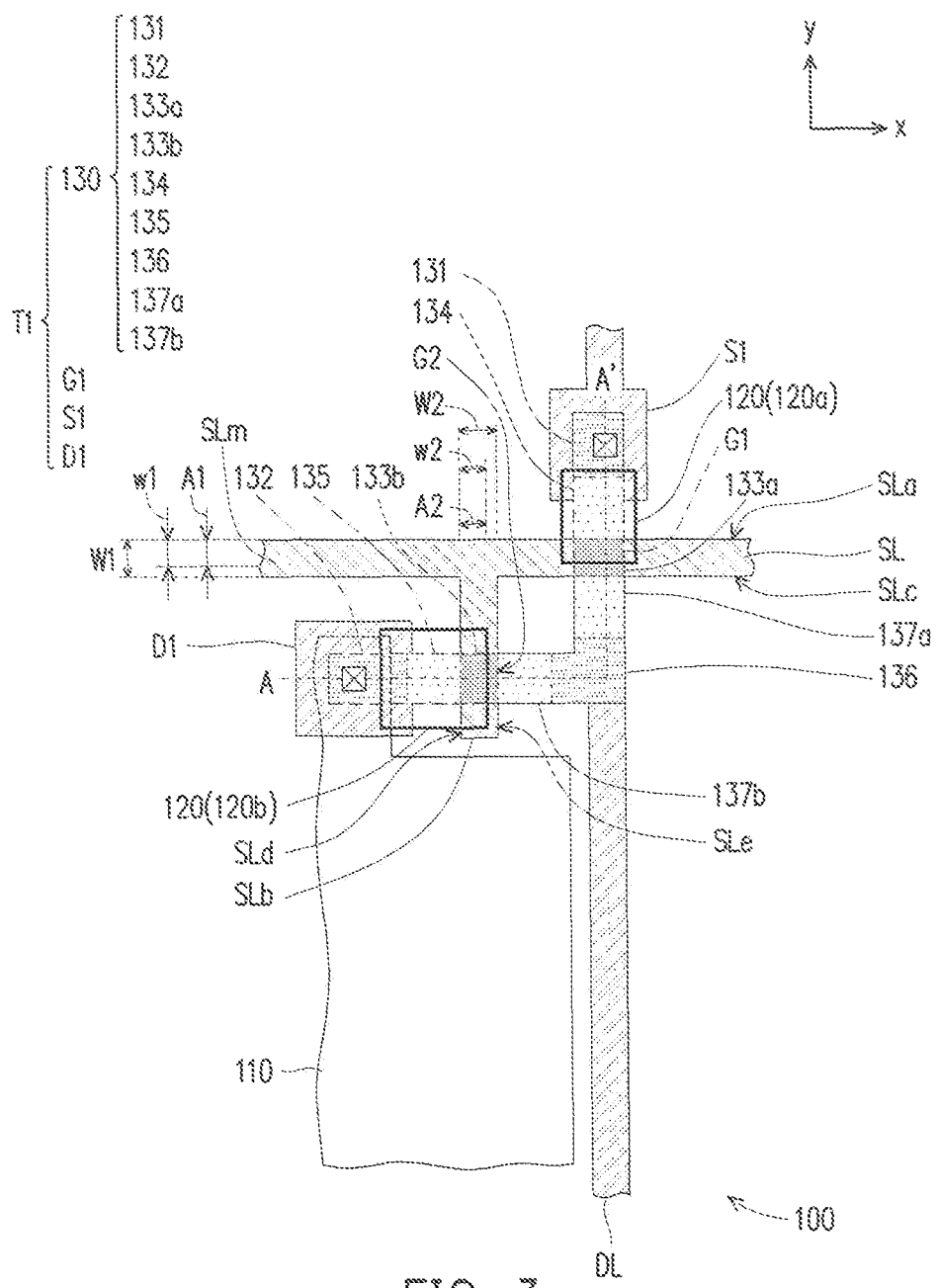
FIG. 3 is a schematic bottom view illustrating the display panel where the black matrix layer of FIG. 1 is omitted.

FIG. 1 is a schematic bottom view illustrating a display panel using a pixel structure according to an embodiment of the invention. FIG. 2 is a schematic cross-sectional view illustrating a display panel using a pixel structure according to an embodiment of the invention. FIG. 3 is a schematic bottom view illustrating the display panel where a black matrix layer 190 of FIG. 1 is omitted. It should be noted that the schematic bottom views in FIGS. 3 and 1 are schematic views viewing in a perspective from a substrate 11 toward a substrate 12 in FIG. 2. FIG. 2 corresponds to a cross-sectional line A-A' in FIGS. 1 and 3. Also, for clearer illustration, FIGS. 1 and 3 omit the substrate 12, a common electrode 180, a display medium 13, a planar layer 160, a protection layer 150, an insulating layer 140, a buffer layer 170, and the substrate 11 shown in FIG. 2, and FIG. 3 further omits the black matrix layer 190 shown in FIG. 1. Referring to FIG. 1, a pixel structure 100 may be disposed between the substrates 11 and 12 opposite to each other. A display panel may be formed by a plurality of the pixel structures 100, the substrates 11 and 12, and the display medium 13 disposed between the substrates 11 and 12. The substrates 11 and 12 may be a light transmissive substrate or an opaque or reflective substrate. The light transmissive substrate may be formed of glass, quartz, organic polymer, or other suitable materials. The opaque or reflective substrate may be formed of a conductive material, a wafer, a ceramic material, or other suitable materials. The display medium 13 may be formed of liquid crystal, an organic light emitting layer, an electro-phoretic display layer, or other suitable materials.

Referring to FIGS. 2 and 3, the pixel structure 100 includes a scan line SL (indicated in FIG. 3), a data line DL (indicated in FIG. 3) intersecting the scan line SL, an active device T1, a pixel electrode 110, and a light shielding pattern 120. The active device T1 includes a semiconductor layer 130, the insulating layer 140 (indicated in FIG. 2) covering the semiconductor layer 130, gate electrodes G1 and G2 located on the insulating layer 140, the protection layer 150 (indicated in FIG. 2) covering the gate electrodes G1 and G2, and a source electrode S1 and a drain electrode D1 located on the protection layer 150.

Referring to FIGS. 2 and 3, the semiconductor layer 130 of the active device T1 includes a source region 131, a drain region 132, channel regions 133a and 133b, a source lightly doped region 134, and a drain lightly doped region 135. The channel regions 133a and 133b are located between the source region 131 and the drain region 132. The source lightly doped region 134 is located between the channel regions 133a and 133b and the source region 131. The drain lightly doped region 135 is located between the channel regions 133a and 133b and the drain region 132. In this embodiment, the semiconductor layer 130 may selectively include a connection region 136 and lightly doped regions 137a and 137b. The channel regions 133a and 133b of the semiconductor layer 130 may include a first channel region 133a and a second channel region 133b. The connection region 136 is located between the first channel region 133a and the second channel region 133b. The lightly doped region 137a is located between the connection region 136 and the first channel region 133a. The lightly doped region 137b is located between the connection region 136 and the second channel region 133b. The source lightly doped region 134 is located between the source region 131 and the first channel region 133a. The drain lightly doped region 135 is located between the drain region 132 and the second channel region 133b. The source lightly doped region 134, the drain lightly doped region 135, and the lightly doped regions 137a and 137b may suppress a current leakage of the active device T1. The connection region 136 may be a heavily doped region, so as to reduce a resistance between the first channel region 133a and the second channel region 133b. As shown in FIG. 3, in this embodiment, the semiconductor layer 130 may optionally be an L-shaped pattern. It should be noted that the invention does not intend to limit that the active T1 includes multiple channel regions (i.e., the first and second channel regions 133a and 133b), the connection region 136, and/or the lightly doped regions 137a and 137b, and does not intend to limit that the semiconductor layer 130 is in an L-shaped pattern, either. In other embodiments, the active device may optionally not include multiple channel regions, the connection region, and/or the lightly doped regions, and the semiconductor layer may also be designed to be in other shapes based on the practical needs.

As shown in FIG. 2, in this embodiment, the insulating layer 140 may be a plurality of insulating films 142 and 144 sequentially stacked on the semiconductor layer 130. However, the invention is not limited thereto. In other embodiments, the insulating layer 140 may also be a single layer. The insulating layer 140 may be formed of an inorganic material (e.g., silicon oxide, silicon nitride, silicon oxynitride, etc.,), an organic material, or a combination thereof.

Referring to FIG. 3, the gate electrodes G1 and G2 are electrically connected to the scan line SL. As shown in FIG. 2, in this embodiment, the gate electrodes G1 and G2 may optionally include a first gate electrode G1 and a second gate electrode G2 connected to each other and respectively located above the first and second channel regions 133a and 133b. The dual-gate (i.e., the first and second gate electrodes G1 and G2) design may suppress the current leakage of the active device T1. As shown in FIG. 3, in this embodiment, the scan line SL includes a main portion SLm whose extending direction x is perpendicular to an extending direction Y of the data line DL and a branch portion SLb extending outward from the main portion SLm. The first gate electrode G1 is a portion of the main portion SLm of the scan line SL, for example, while the second gate G2 is a portion of the branch portion SLb of the scan line SL, for example. The gate electrodes G1 and G2 and the scan line SL may optionally be formed of the same layer. However, the invention is not limited thereto. In other embodiments, the gate electrodes G1 and G2 and the scan line SL may also belong to different layers. For the concern of conductivity, the scan line SL and the gate electrodes G1 and G2 may be formed of metallic materials. However, the invention is not limited thereto. In other embodiments, the scan line SL and the gate electrodes G1 and G2 may also be formed of other conductive materials, such as alloy, nitride of a metallic material, oxide of a metallic material, oxynitride of a metallic material, or a stack layer of metallic and other conductive materials.

As shown in FIG. 2, in this embodiment, the protection layer 150 may be a plurality of protection films 152 and 154 sequentially stacked on the gate electrodes G1 and G2. However, the invention is not limited thereto. In other embodiments, the protection layer 150 may also be a single layer. The protection layer 150 may be formed of an inorganic material (e.g., silicon oxide, silicon nitride, silicon oxynitride, etc.,), an organic material, or a combination thereof.

As shown in FIGS. 2 and 3, the source electrode S1 and the drain electrode D1 are respectively electrically connected with the source region 131 and the drain region 132. More specifically, as shown in FIG. 2, in this embodiment, the insulating layer 140 has through holes 140a and 140b, and the protection layer 150 has through holes 150a and 150b. The through hole 140a is in communication with the through hole 150a, and the through hole 140b is in communication with the through hole 150b. The source electrode S1 is filled into the through holes 140a and 150a, so as to electrically contact the source region 131, while the drain electrode D1 is filled into the through holes 140b and 150b, so as to electrically contact the drain region 132. As shown in FIG. 3, the source electrode S1 is electrically connected to the data line DL. In this embodiment, the source electrode S1 may be considered as a portion of the data line DL. The source electrode S1 and the drain electrode D1 are separate from each other, while the source electrode S1, the drain electrode D1, and the data line DL may be formed of the same layer. However, the invention is not limited thereto. In other embodiments, the source electrode S1, the drain electrode D1, and the data line DL may also belong to different layers.

As shown in FIG. 3, in this embodiment, the source electrode S1 and the drain electrode D1 may be respectively located at two sides of the scan line SL. In other words, the scan line SL may cross the semiconductor layer 130. Two ends of the semiconductor layer 130 are respectively located at two sides of the scan line SL, while the source electrode S1 and the drain electrode D1 are respectively and correspondingly disposed at two ends of the semiconductor layer 130. However, the invention is not limited thereto. In other embodiments, the source electrode S1 and the drain electrode D1 may also be disposed at other suitable positions.

As shown in FIGS. 2 and 3, the pixel electrode 110 is electrically connected to the drain electrode D1. More specifically, as shown in FIG. 2, the pixel structure 100 of this embodiment further includes the planar layer 160 covering the source electrode S1 and the drain electrode D1. The planar layer 160 has a through hole 160a. The pixel electrode 110 is disposed on the planar layer 160. The pixel electrode 110 is filled into the through hole 160a of the planar layer 160, so as to electrically contact the drain electrode D1. The pixel electrode 110 may be a transmissive pixel electrode, a reflective pixel electrode, or a transflective pixel electrode. The transmissive pixel electrode may be formed of a metal oxide, such as indium tin oxide, indium zinc oxide, aluminum tin oxide, aluminum zinc oxide, indium germanium zinc oxide, other suitable materials, or a stack layer of at least two of the aforesaid materials. The reflective pixel electrode may be formed of a metallic material having a high reflective index or other suitable materials.

As shown in FIGS. 2 and 3, the light shielding pattern 120 shields the source region 131, the drain region 132, the source lightly doped region 134, and the drain lightly doped region 135 of the semiconductor layer 130. In this embodiment, the light shielding pattern 120 does not shield the connection region 136 and the lightly doped regions 137a and 137b. More specifically, the light shielding pattern 120 includes a first light shielding pattern 120a and a second light shielding pattern 120b respectively overlapping the first channel region 133a and the second channel region 133b. The first light shielding pattern 120a shields the source region 131, the source lightly doped region 134, and a portion of the first channel region 133a adjacent to the source lightly doped region 134. The first light shielding pattern 120a does not shield another portion of the first channel region 133a away from the source lightly doped region 134, the lightly doped region 137a, and the connection region 136. The second light shielding pattern 120b shields the source region 132, the drain lightly doped region 135, and a portion of the second channel region 133b adjacent to the drain lightly doped region 135. The second light shielding pattern 120b does not shield another portion of the second channel region 133b away from the drain lightly doped region 135, the lightly doped region 137b, and the connection region 136.

As shown in FIG. 3, the light shielding pattern 120 is overlapped with a side SLa, SLd of the scan line SL, but not overlapped with another side SLc, SLe of the scan line SL. In this embodiment, there are overlapped regions A1 and A2 between the light shielding pattern 120 and the scan line SL, and widths w1 and w2 of the overlapped regions A1 and A2 are respectively greater than or equal to a half of a width W1 and a half of a width W2 of the scan line SL. However, the invention is not limited thereto. More specifically, the main portion SLm of the scan line SL has opposite sides SLa and SLc, the side SLa is more distant from the pixel electrode 110 of the pixel structure 100 than the side SLc, and the first light shielding pattern 120a shields the side SLa but does not shield the side SLc. The main portion SLm of the scan line SL has the width W1 in the extending direction y of the data line DL, the overlapped region A1 between the first light shielding pattern 120a and the scan line SL has the width w1 in the direction y, and $50\% \leq (w1/W1) \leq 100\%$. The branch portion SLb of the scan line SL has opposite sides SLd and SLe, the side SLd is more distant from the data line DL of the pixel structure 100, and the second light shielding pattern 120b shields the side SLb but does not shield the side SLe. The branch portion SLb of the scan line SL has the width W2 in the direction x perpendicular to the direction y, the overlapped area A2 between the second light shielding pattern 120b and the scan line SL has the width w2 in the direction x, and $50\% \leq (w2/W2) \leq 100\%$. However, the invention is not limited thereto.

As shown in FIG. 2, in this embodiment, the first light shielding pattern 120a and the second light shielding pattern 120b are located below the semiconductor layer 130. In other words, the semiconductor layer 130 is located between the first light shielding pattern 120a and the second light shielding pattern 120b and the insulating layer 140. The buffer layer 170 is further disposed between the first light shielding pattern 120a and the second light shielding pattern 120b and the semiconductor layer 130. In this embodiment, the buffer layer 170 may be a plurality of buffer films 172 and 174 sequentially covering the first light shielding pattern 120a and the second light shielding pattern 120b. However, the invention is not limited thereto. In other embodiments, the buffer layer 170 may also be a single layer. The buffer layer 170 may be formed of an inorganic material (e.g., silicon oxide, silicon nitride, silicon oxynitride, etc.,), an organic material, or a combination thereof.

It should be noted that, with the design "the light shielding pattern 120 is overlapped with a side SLa, SLd of the scan line SL, but not overlapped with another side SLc, SLe of the scan line SL", the light shielding pattern 120 may shield a region that may easily have a current leakage in the pixel structure 100 (i.e., an area around the interface between the source region 131 and the source lightly doped region 134, the source lightly doped region 134, an area around the interface between the source lightly doped region 134 and the channel regions 133a and 133b, an area around the interface between the drain region 132 and the drain lightly doped region 135, the drain lightly doped region 135, and an area around the interface between drain lightly doped region 135 and the channel regions 133a and 133b), and reduces the size of this region, thereby increasing an aperture ratio of the pixel structure 100. In addition, compared with the conventional pixel structure, the pixel structure 100 of this embodiment adopts the design of disconnected light shielding pattern 120, such that a parasitic capacitance between two adjacent pixel structures 100 is reduced, so as to reduce the cross-talk of the display panel using the pixel structure 100 and maintain the characteristic of hardly having flick.

As shown in FIG. 2, the pixel structure 100 of this embodiment further includes the common electrode 180. The common electrode 180 corresponds to the pixel structure 110. An electrical field between the pixel electrode 110 and the common electrode 180 drives the display medium 13, thereby allowing the display panel using the pixel structure 100 to display a frame. In the embodiment of FIG. 2, the pixel electrode 110 and the common electrode 180 may selectively be respectively disposed on different substrates 11 and 12. The display panel using the pixel structure 100 may be a display panel in the twisted nematic (TN) mode, a display panel in the super twisted nematic (STN) mode, a display panel in the vertical alignment (VA) mode, a display panel in the polymer sustained alignment (PSA)

mode, a display panel in the optically compensated birefringence (OCB) mode, or a display panel in other suitable modes. However, the invention is not limited thereto. In other embodiments, the pixel electrode 110 and the common electrode 180 may be located between the substrate 11 and the display medium 13, and the display panel using such pixel structure may also be a display panel in the fringe-field switching (FFS) mode, a display panel in the in-plane switching (IPS) mode, or a display panel in other suitable modes.

As shown in FIGS. 1 and 2, the pixel structure 100 of this embodiment may further include the black matrix layer 190. As shown in FIG. 2, the black matrix layer 190 may be disposed on the substrate 12 and located between the substrate 12 and the display medium 13. As shown in FIG. 1, the black matrix layer 190 includes a first light blocking portion 192 and a second light blocking portion 194 respectively parallel to the scan line SL and the data line DL. In this embodiment, the first light blocking portion 192 shields the drain electrode D1 but does not shields the source electrode S1. However, the invention is not limited thereto. The black matrix layer 190 may be formed of black resin, a metal having a low reflective index (e.g., chromium, etc.,), or other suitable materials.

Figure 4:
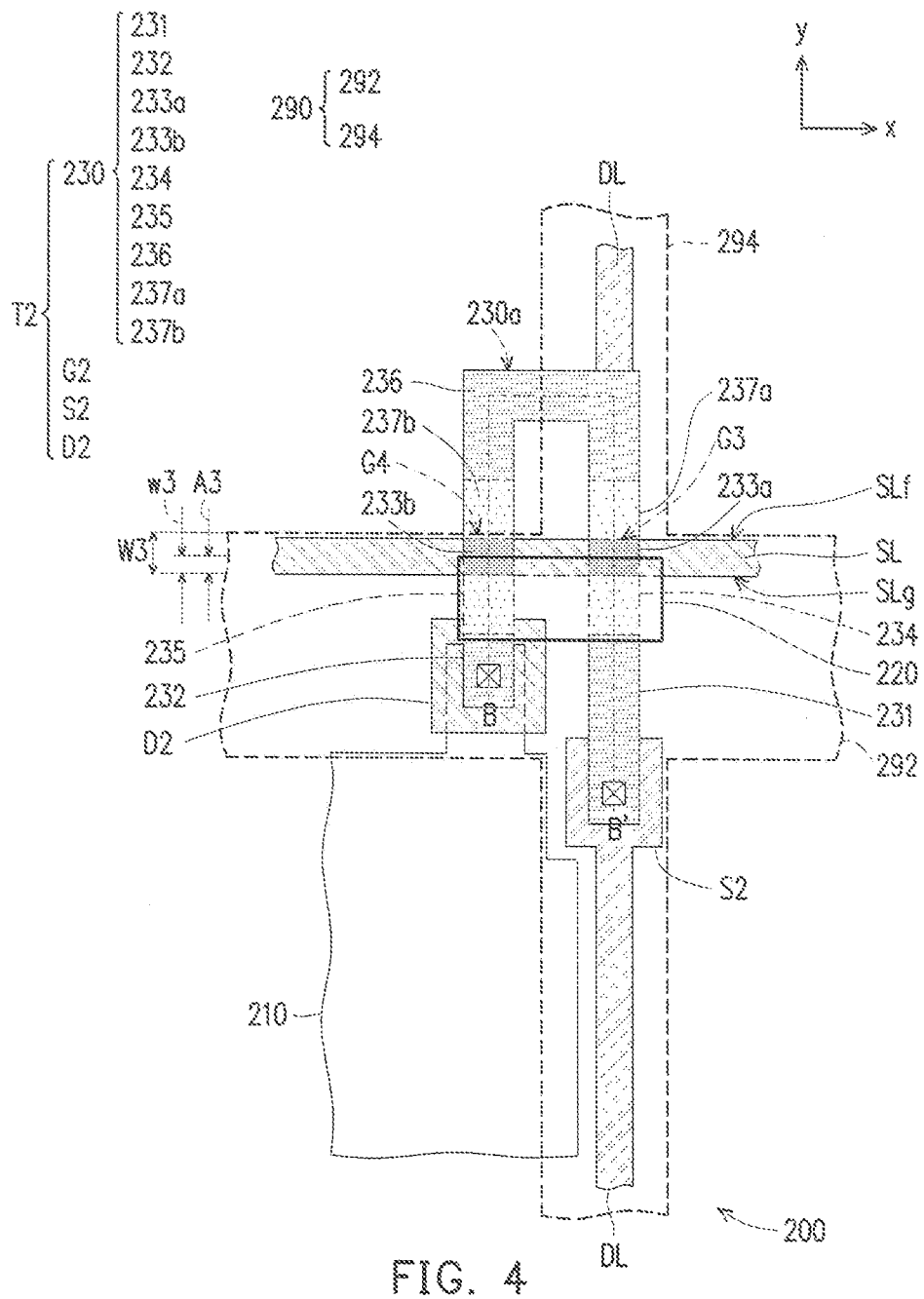
FIG. 4 is a schematic bottom view illustrating a display panel using a pixel structure according to another embodiment of the invention.
Figure 5:
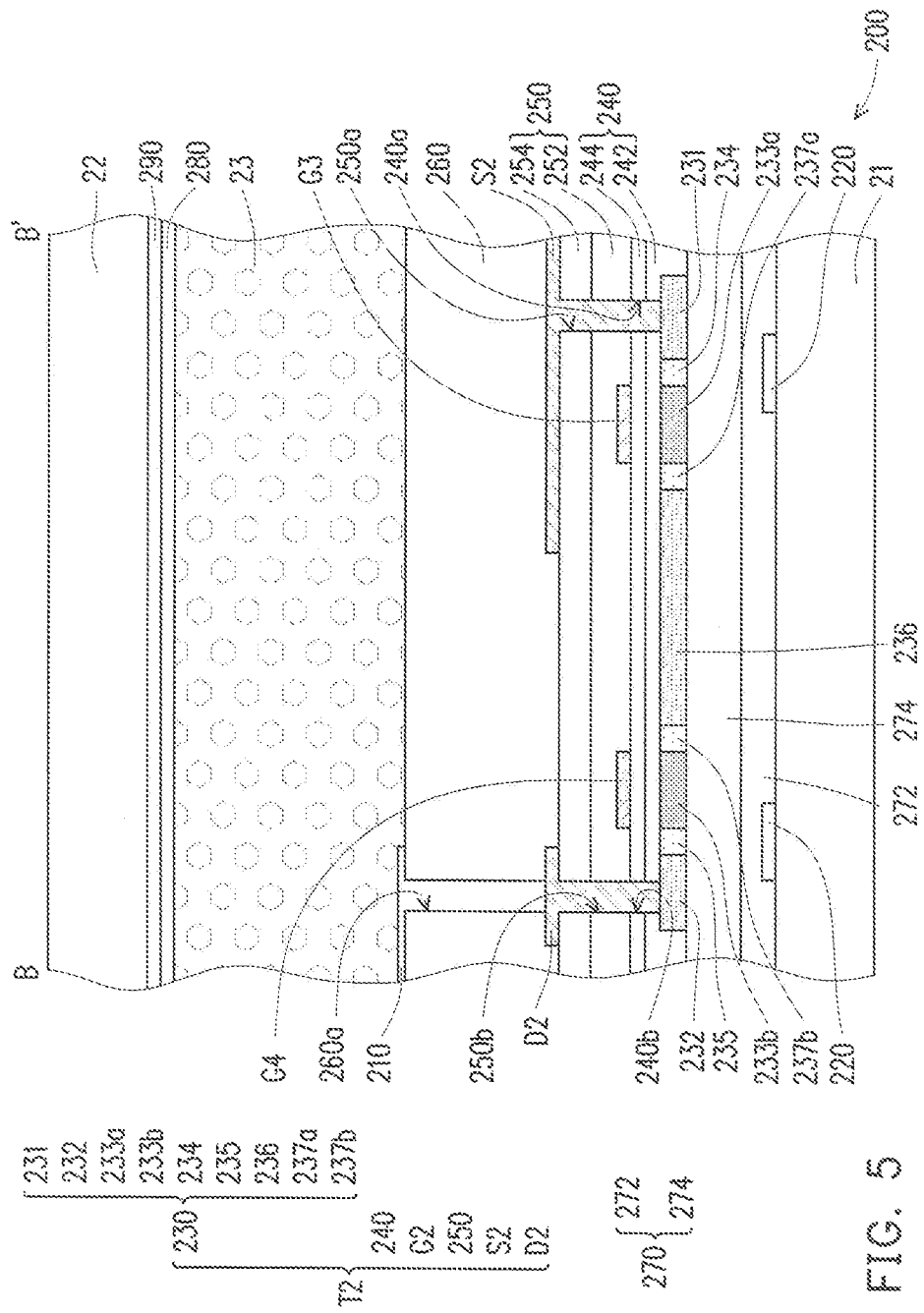
FIG. 5 is a schematic cross-sectional view illustrating a display panel using a pixel structure according to another embodiment of the invention.
Figure 6:
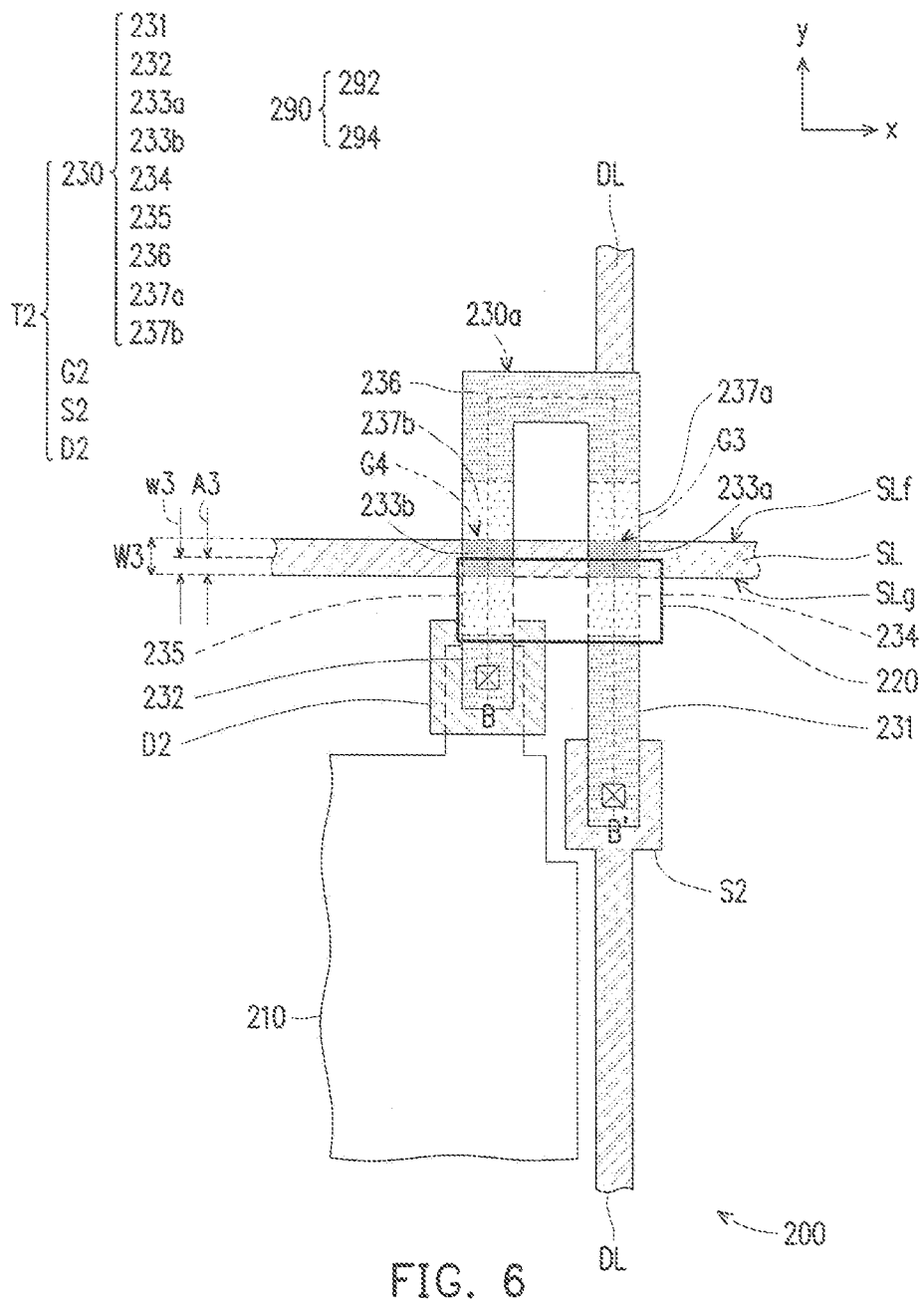
FIG. 6 is a schematic bottom view illustrating the display panel where the black matrix layer of FIG. 4 is omitted.

FIG. 4 is a schematic bottom view illustrating a display panel using a pixel structure according to another embodiment of the invention. FIG. 5 is a schematic cross-sectional view illustrating a display panel using a pixel structure according to another embodiment of the invention. FIG. 6 is a schematic bottom view illustrating the display panel where a black matrix layer 290 of FIG. 4 is omitted. It should be noted that the bottom views in FIGS. 4 and 6 are schematic views viewing in a perspective from a substrate 21 toward a substrate 22 in FIG. 5. FIG. 5 corresponds to a cross-sectional line B-B' in FIGS. 4 and 6. Also, for clearer illustration, FIGS. 4 and 6 omit the substrate 22, a common electrode 280, a display medium 23, a planar layer 260, a protection layer 250, an insulating layer 240, a buffer layer 270, and the substrate 21 shown in FIG. 5, and FIG. 6 further omits the black matrix layer 290 shown in FIG. 4. The pixel structure 200 shown in FIGS. 4 to 6 and the pixel structure 100 shown in FIGS. 1 to 3 are similar. Thus, corresponding components are referred to with corresponding reference numerals. Referring to FIG. 5, a pixel structure 200 may be disposed between the substrates 21 and 22 opposite to each other. A display panel for displaying a frame is formed by a plurality of the pixel structures 200, the substrates 21 and 22, and the display medium 23 disposed between the substrates 21 and 22. Materials of the substrates 21 and 22 and the display medium 23 are similar to those of the substrates 11 and 12 and the display medium 13, and thus are not repeated in the following.

Referring to FIGS. 5 and 6, the pixel structure 200 includes a scan line SL (indicated in FIG. 6), a data line DL (indicated in FIG. 6) intersecting the scan line SL, an active device T2, a pixel electrode 210, and a light shielding pattern 220. The active device T2 includes a semiconductor layer 230, the insulating layer 240 (indicated in FIG. 5) covering the semiconductor layer 230, gate electrodes G3 and G4 located on the insulating layer 240, the protection layer 250 (indicated in FIG. 5) covering the gate electrodes G3 and G4, and a source electrode S2 and a drain electrode D2 disposed on the protection layer 250.

Referring to FIGS. 5 and 6, the semiconductor layer 230 of the active device T2 includes a source region 231, a drain region 232, channel regions 233a and 233b, a source lightly doped region 234, and a drain lightly doped region 235. The channel regions 233a and 233b are located between the source region 231 and the drain region 232. The source lightly doped region 234 is located between the channel regions 233a and 233b and the source region 231. The drain lightly doped region 235 is located between the channel regions 233a and 233b and the drain region 232. In this embodiment, the semiconductor layer 230 may selectively include a connection region 236 and lightly doped regions 237a and 237b. The channel regions 233a and 233b of the semiconductor layer 230 may include a first channel region 233a and a second channel region 233b. The connection region 236 is located between the first channel region 233a and the second channel region 233b. The lightly doped region 237a is located between the connection region 236 and the first channel region 233a. The lightly doped region 237b is located between the connection region 236 and the second channel region 233b. The source lightly doped region 234 is located between the source region 231 and the first channel region 233a. The drain lightly doped region 235 is located between the drain region 232 and the second channel region 233b. The source lightly doped region 234, the drain lightly doped region 235, and the lightly doped regions 237a and 237b may suppress a current leakage of the active device T2. The connection region 236 may be a heavily doped region, so as to reduce a resistance between the first channel region 233a and the second channel region 233b. What differs from the pixel structure 100 is that, in the pixel structure 200, the semiconductor layer 230 may be optionally in a U-shaped pattern, as shown in FIG. 6. However, the invention is not limited thereto.

As shown in FIG. 5, in this embodiment, the insulating layer 240 may be a plurality of insulating films 242 and 244 sequentially stacked on the semiconductor layer 230. However, the invention is not limited thereto. In other embodiments, the insulating layer 240 may also be a single layer. The insulating layer 240 may be formed of an inorganic material (e.g., silicon oxide, silicon nitride, silicon oxynitride, etc.,), an organic material, or a combination thereof.

As shown in FIG. 6, the gate electrodes G3 and G4 are electrically connected to the scan line SL. As shown in FIGS. 5 and 6, in this embodiment, the gate electrodes G3 and G4 may optionally include a first gate electrode G3 and a second gate electrode G4 respectively connected to each other and located above the first and second channel regions 233a and 233b. The first gate electrode G3 and the second gate electrode G4 may be portions in the scan line SL respectively overlapping the semiconductor layer 230. The gate electrodes G3 and G4 and the scan line SL may optionally be formed of the same layer. However, the invention is not limited thereto. In other embodiments, the gate electrodes G3 and G4 and the scan line SL may also belong to different layers. Materials suitable for the gate electrodes G3 and G4 and the scan line SL are similar to those of the gate electrodes G1 and G2 and the scan line SL, and are thus not repeated in the following.

As shown in FIG. 5, in this embodiment, the protection layer 250 may be a plurality of protection films 252 and 254 sequentially stacked on the gate electrodes G3 and G4. However, the invention is not limited thereto. In other embodiments, the protection layer 250 may also be a single layer. Materials suitable for the protection layer 250 are similar to those of the protection layer 150, and are thus not repeated in the following.

As shown in FIGS. 5 and 6, the source electrode S2 and the drain electrode D2 are respectively electrically connected with the source region 231 and the drain region 232. More specifically, in this embodiment, the insulating layer 240 has through holes 240a and 240b, and the protection layer 250 has through holes 250a and 250b, as shown in FIG. 5. The through hole 240a is in communication with the through hole 250a, and the through hole 240b is in communication with the through hole 250b. The source electrode S2 is filled into the through holes 240a and 250a, so as to electrically contact the source region 231, while the drain electrode D2 is filled into the through holes 240b and 250b, so as to electrically contact the drain region 232. As shown in FIG. 6, the source electrode S2 is electrically connected to the data line DL. In this embodiment, the source electrode S2 may be considered as a portion of the data line DL. The source electrode S2 and the drain electrode D2 are separate from each other, while the source electrode S2, the drain electrode D2, and the data line DL may be formed of the same layer. However, the invention is not limited thereto. In other embodiments, the source electrode S2 may be a conductive pattern extending outward from the data line DL. The source electrode S2, the drain electrode D2, and the data line DL may also belong to different layers.

As shown in FIG. 6, what differs from the pixel structure 100 is that, in the pixel structure 200, the source electrode S2 and the drain electrode D2 are respectively and correspondingly disposed at two ends of the semiconductor layer 230 in the U-shaped pattern, and a bent portion 230a of the semiconductor layer 230 in the U-shaped pattern is located at another side of the scan line SL. The source electrode S2 and the drain electrode D2 are located at the same side of the scan line SL. However, the invention is not limited thereto. In other embodiments, the source electrode S2 and the drain electrode D2 may also be disposed at other suitable positions.

As shown in FIGS. 5 and 6, the pixel electrode 210 is electrically connected to the drain electrode D2. More specifically, as shown in FIG. 5, the pixel structure 200 of this embodiment further includes the planar layer 260 covering the source electrode S2 and the drain electrode D2. The planar layer 260 has a through hole 260a. The pixel electrode 210 is disposed on the planar layer 260. The pixel electrode 210 is filled into the through hole 260a of the planar layer 260, so as to electrically contact the drain electrode D2. The pixel electrode 210 may be a transmissive pixel electrode, a reflective pixel electrode, or a transflective pixel electrode. Materials suitable for the planar electrode 210 and the planar layer 260 are similar to those of the pixel electrode 110 and the planar layer 160, and are thus not repeated in the following.

As shown in FIGS. 5 and 6, the light shielding pattern 220 shields the source region 231, the drain region 232, the source lightly doped region 234, and the drain lightly doped region 235 of the semiconductor layer 230. In this embodiment, the light shielding pattern 220 may optionally not shield the connection region 236 and the lightly doped regions 237a and 237b. As shown in FIG. 6, the light shielding pattern 220 is overlapped with a side SLg of the scan line SL, while the light shielding pattern 220 is not overlapped with another side SLf of the scan line SL. In addition, the side SLg is closer to the pixel electrode 210 of the pixel structure 200 than the side SLf. In this embodiment, there is an overlapped region A3 between the light shielding pattern 220 and the scan line SL, and a width w3 of the overlapped region A3 is greater than or equal to a half of a width W3 of the scan line SL. However, the invention is not limited thereto.

As shown in FIG. 5, in this embodiment, the light shielding layer 220 is located below the semiconductor layer 230. In other words, the semiconductor layer 230 is located between the light shielding layer 220 and the insulating layer 240. The buffer layer 270 is further disposed between the light shielding layer 220 and the semiconductor layer 230. In this embodiment, the buffer layer 270 may be a plurality of buffer films 272 and 274 sequentially covering the light shielding layer 220. However, the invention is not limited thereto. In other embodiments, the buffer layer 270 may also be a single layer. Materials suitable for the buffer layer 270 are similar to those of the buffer layer 170, and are thus not repeated in the following.

Similarly, with the design "the light shielding pattern 220 is overlapped with the side SLg of the scan line SL, and not overlapped with another side SLc of the scan line SL", the light shielding pattern 220 may shield a region that may easily have a current leakage in the pixel structure 200 (i.e., an area around the interface between the source region 231 and the source lightly doped region 234, the source lightly doped region 234, an area around the interface between the source lightly doped region 234 and the channel regions 233a and 233b, an area around the interface between the drain region 232 and the drain lightly doped region 235, the drain lightly doped region 235, and an area around the interface between drain lightly doped region 235 and the channel regions 233a and 233b), and reduces the size of this region, thereby increasing an aperture ratio of the pixel structure 200.

As shown in FIG. 5, the pixel structure 200 of this embodiment further includes the common electrode 280 corresponding to the pixel electrode 210. An electrical field between the pixel electrode 210 and the common electrode 280 drives the display medium 23, thereby allowing the display panel using the pixel structure 200 to display a frame. In the embodiment of FIG. 5, the pixel electrode 210 and the common electrode 280 may selectively be respectively disposed on different substrates 21 and 22. The display panel using the pixel structure 200 may be a display panel in the twisted nematic (TN) mode, a display panel in the super twisted nematic (STN) mode, a display panel in the vertical alignment (VA) mode, a display panel in the polymer sustained alignment (PSA) mode, a display panel in the optically compensated birefringence (OCB) mode, or a display panel in other suitable modes. However, the invention is not limited thereto. In other embodiments, the pixel electrode 210 and the common electrode 280 may be disposed on the same substrate 21 and located between the substrate 21 and the display medium 23, and the display panel using such pixel structure may also be a display panel in the fringe-field switching (FFS) mode, a a display panel in the in-plane switching (IPS) mode, or a display panel in other suitable modes.

As shown in FIGS. 4 and 5, the pixel structure 200 of this embodiment may further include the black matrix layer 290. As shown in FIG. 4, the black matrix layer 290 may be disposed on the substrate 22 and located between the substrate 22 and the display medium 23. As shown in FIG. 4, the black matrix layer 290 includes a first light blocking portion 292 and a second light blocking portion 294 respectively parallel to the scan line SL and the data line DL. In this embodiment, the first light blocking portion 292 shields the drain electrode D2 but does not shields the source electrode S2, and the first light blocking portion 292 of the black matrix layer 290 does not overlap the bent portion 230a of the semiconductor layer 230. However, the invention is not limited thereto. The black matrix layer 290 may be formed of black resin, a metal having a low reflective index (e.g., chromium, etc.,), or other suitable materials.

In view of the foregoing, the pixel structure according to the embodiments of the invention adopts the design "the light shielding pattern is overlapped with a side of the scan line, and not overlapped with another side of the scan line", such that the light shielding pattern may shield the region that may easily have a current leakage and reduce a size thereof, so as to increase the aperture ratio of the pixel structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
    a scan line and a data line intersecting each other;
    an active device, electrically connected to the scan line and the data line, wherein the active device comprises:
        a semiconductor layer, comprising a source region, a drain region, a channel region, a source lightly doped region, and a drain lightly doped region, wherein the channel region is located between the source region and the drain region, the source lightly doped region is located between the channel region and the source region, and the drain lightly doped region is located between the channel region and the drain region;
        an insulating layer, covering the semiconductor layer;
        a gate electrode, located on the insulating layer above the channel region and electrically connected to the scan line;
        a protection layer, covering the gate electrode; and
        a source electrode and a drain electrode, located on the protection layer and respectively electrically connected to the source region and the drain region, wherein the source electrode is electrically connected to the data line;
    a pixel electrode, electrically connected to the drain electrode; and
    a light shielding pattern, shielding the source region, the drain region, the source lightly doped region and the drain lightly doped region of the semiconductor layer, wherein the light shielding pattern is overlapped with a side of the scan line and not overlapped with another side of the scan line.

2. The pixel structure as claimed in claim 1, wherein there is an overlapped region between the light shielding pattern and the scan line, and a width of the overlapped region is in a range from 50% to 100% of a width of the scan line.

3. The pixel structure as claimed in claim 1, wherein the light shielding layer is located below the semiconductor layer, and a buffer layer is further disposed between the light shielding layer and the semiconductor layer.

4. The pixel structure as claimed in claim 1, wherein:
    the semiconductor layer further comprises a connection region and a lightly doped region, and the channel region of the semiconductor layer further comprises a first channel region and a second channel region, wherein the connection region is located between the first channel region and the second channel region, the lightly doped region is located between the connection region and the first channel region and between the connection region and the second channel region, the source lightly doped region is located between the source region and the first channel region, and the drain lightly doped region is located between the drain region and the second channel region; and the gate electrode comprises a first gate electrode and a second gate electrode respectively located above the first channel region and the second channel region, wherein the first gate electrode and the second gate electrode are connected to each other.

5. The pixel structure as claimed in claim 4, wherein the light shielding pattern does not shield the connection region and the lightly doped region.

6. The pixel structure as claimed in claim 4, wherein the light shielding pattern shields a portion of the first channel region and a portion of the second channel region.

7. The pixel structure as claimed in claim 1, wherein the source electrode and the drain electrode are respectively located at two sides of the scan line.

8. The pixel structure as claimed in claim 7, further comprising a black matrix layer, wherein the black matrix layer comprises a first light blocking portion and a second light blocking portion respectively parallel to the scan line and the data line, and the first light blocking portion of the black matrix layer shields the drain electrode but does not shield the source electrode.

9. The pixel structure as claimed in claim 7, wherein the semiconductor layer is an L-shaped pattern, and the source electrode and the drain electrode are respectively and correspondingly disposed at two ends of the semiconductor layer in the L-shaped pattern.

10. The pixel structure as claimed in claim 1, wherein the source electrode and the drain electrode are located at the same side of the scan line.

11. The pixel structure as claimed in claim 10, further comprising a black matrix layer disposed in correspondence with the scan line and the data line, wherein the black matrix layer shields the drain electrode but does not shield the source electrode.

12. The pixel structure as claimed in claim 10, wherein the semiconductor layer is in a U-shaped pattern, the source electrode and the drain electrode are respectively and correspondingly disposed at two ends of the semiconductor layer in the U-shaped pattern, and a bent portion of the semiconductor layer in the U-shaped pattern is located at another side of the scan line.

13. The pixel structure as claimed in claim 12, further comprising a black matrix layer, wherein the black matrix layer comprises a first light blocking portion and a second light blocking portion respectively parallel to the scan line and the data line, the first light blocking portion of the black matrix layer shields the drain electrode but does not shield the source electrode, and the first light blocking portion of the black matrix layer is not overlapped with the bent portion of the semiconductor layer.

14. The pixel structure as claimed in claim 1, further comprising a common electrode disposed in correspondence with the pixel electrode.

* * * * *